United States Patent [19]

Tralonga

[11] 4,301,889

[45] Nov. 24, 1981

[54] SPEAKER ENCLOSURE

[76] Inventor: David V. Tralonga, 1224 N. Prospect Ave., Milwaukee, Wis. 53202

[21] Appl. No.: 61,249

[22] Filed: Jul. 27, 1979

[51] Int. Cl.³ ............................................ H05K 5/00

[52] U.S. Cl. .................................. 181/145; 181/146; 181/151; 181/156; 181/199

[58] Field of Search ............... 181/144, 145, 146, 148, 181/151, 152, 155, 156, 191, 199; 179/1 E

[56] References Cited

U.S. PATENT DOCUMENTS

| | | | |
|---|---|---|---|
| 2,087,901 | 7/1937 | Coots | 181/199 |
| 2,143,175 | 1/1939 | Waite | 179/1 E |
| 2,491,982 | 12/1949 | Kincart | 181/156 |
| 3,712,411 | 1/1973 | Monroe | 181/156 |
| 4,173,266 | 11/1979 | Pizer et al. | 181/156 |
| 4,220,220 | 9/1980 | Ripple | 181/156 |

*Primary Examiner*—L. T. Hix
*Assistant Examiner*—Benjamin R. Fuller
*Attorney, Agent, or Firm*—Andrus, Sceales, Starke & Sawall

[57] ABSTRACT

A speaker enclosure comprising a cabinet that defines an upper compartment and a lower compartment. A sectorial horn is mounted in the upper compartment and a prismatic member is disposed across the outlet of the horn to direct the sound energy upwardly and downwardly from the horn. Mounted in the lower compartment is a full range speaker which is spaced from the sides of the cabinet to provide side openings. Positioned behind the speaker is a W-shaped baffle which serves to deflect the sound energy emitted from the rear of the speaker outwardly through the side openings.

3 Claims, 3 Drawing Figures

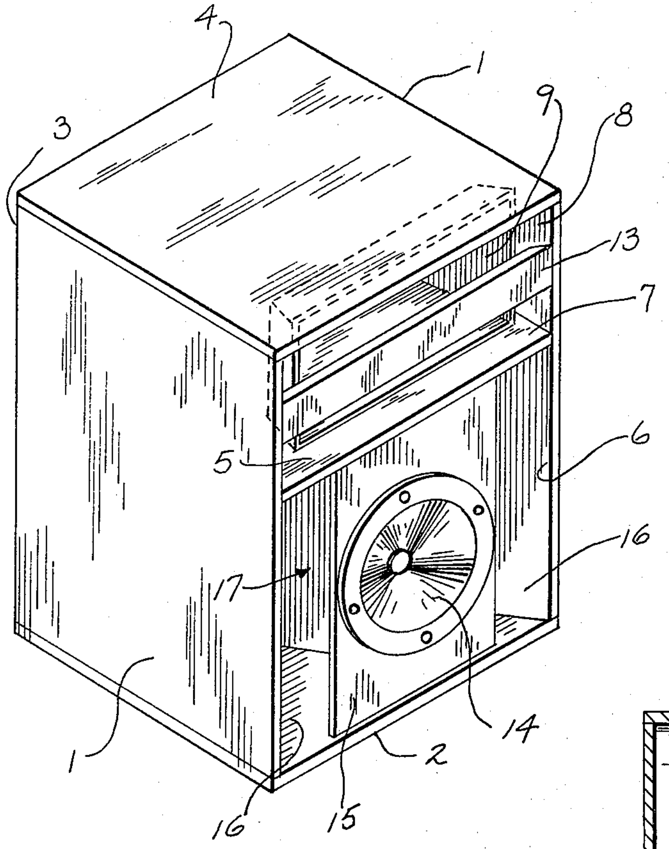
Fig.1
Fig.2
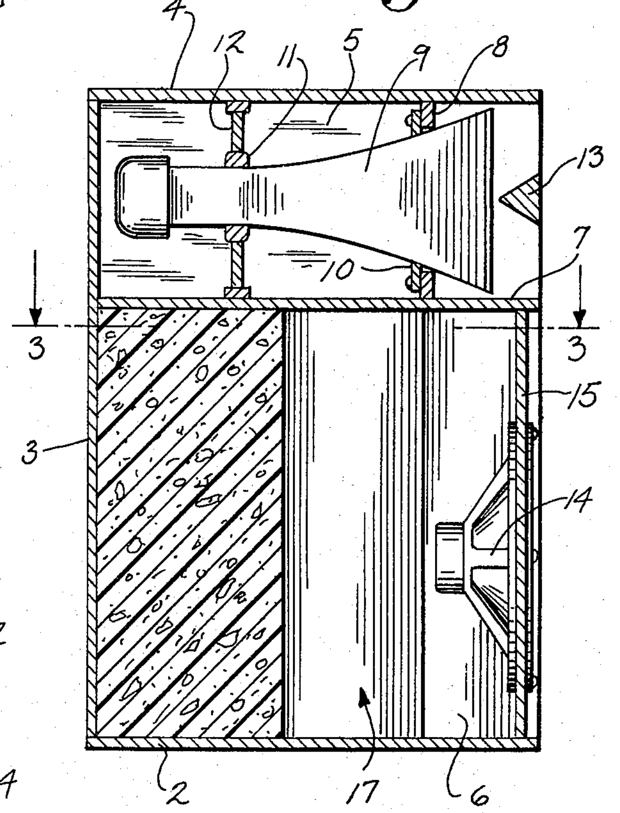
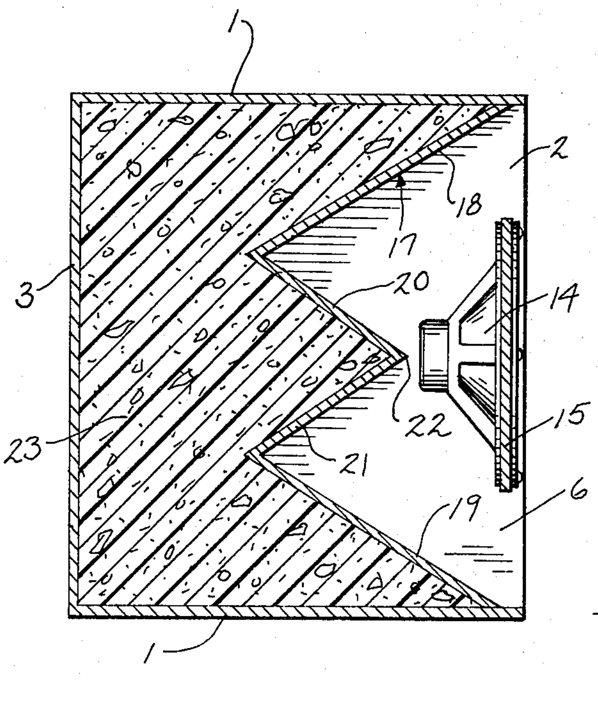
Fig.3

SPEAKER ENCLOSURE

BACKGROUND OF THE INVENTION

Many types of speaker enclosures have been designed in the past for improving the audio reproduction obtained from the speaker. The enclosures are designed primarily to improve the quality and relative amplitude of the lower frequency musical sound, and some enclosures have been used for reflecting and reinforcing the sounds received from the rear portion of the speaker. In spite of these attempts, there is a continuing demand for a speaker enclosure that demonstrates improved tone quality for sound reproduction.

SUMMARY OF THE INVENTION

The invention is directed to a speaker enclosure or cabinet which defines an upper compartment and a lower compartment. A sectorial horn is located in the upper compartment and a generally triangular or prismatic member is mounted across the outlet of the horn and serves to deflect the sound energy from the horn in both an upward and downward path.

Mounted within the lower compartment is a low frequency speaker, and the speaker is spaced from the side walls of the cabinet to provide a pair of side openings. The outlet of the speaker faces outwardly of the cabinet, and a generally W-shaped baffle is positioned to the rear of the speaker within the lower compartment. With this construction, sound energy eminating from the rear of the speaker is reflected forwardly by the baffle through the side openings which border the speaker. This results in greater fidelity, in that substantially all of the sound produced by the speaker is delivered to the surrounding room.

The speaker enclosure of the invention provides crisp and clear sound with minimum distortion, while the base tones are smooth and not overpowering.

Other objects and advantages will appear in the course of the following description.

DESCRIPTION OF THE DRAWINGS

The drawings illustrate the best mode presently contemplated of carrying out the invention.

In the drawings:

FIG. 1 is a perspective view of the speaker enclosure of the invention;

FIG. 2 is a vertical section of the enclosure; and

FIG. 3 is a horizontal section of the enclosure.

DESCRIPTION OF THE PREFERRED EMBODIMENT

FIG. 1 illustrates the speaker enclosure or cabinet of the invention which includes a pair of side walls 1, a bottom wall 2, a rear wall 3 and a top wall 4. The interior of the cabinet is divided into an upper compartment 5 and a lower compartment 6 by a horizontal wall or shelf 7.

A vertical interior wall 8 is spaced to the rear of the front edge of the cabinet, and a sectorial horn 9 is mounted within an opening in wall 8. As best illustrated in FIG. 2, the horn is provided with a peripheral flange 10 which is secured to the inner surface of wall 8 by screws or the like.

To stabilize the rear of the horn, a ring 11 is attached to the outer surface of the horn and is supported from the top wall 4 and the horizontal wall 7 by a bracket 12.

Mounted horizontally across the forward end of the upper compartment 5 is a generally triangular or prismatic member 13. The member 13 is located in alignment with the outlet of horn 9 and serves to deflect the sound energy from the horn both upwardly and downwardly.

A low frequency speaker or woofer 14 is mounted within an opening in a vertical wall 15 that is secured across the forward end of the lower compartment 6. As best illustrated in FIG. 1, the side edges of the wall 15 are spaced from the side walls 1 to provide a pair of side openings 16 which extend the full height of the lower compartment 6.

The speaker 14 faces outwardly and a baffle 17, having a generally W-shaped configuration in horizontal cross section, is mounted directly behind speaker 14 within the lower compartment. The W-baffle 17 is formed with a pair of side sections 18 and 19 and a pair of central sections 20 and 21 which are joined together at an apex 22. As illustrated in FIG. 3, the apex 22 of the W-baffle 17 is located immediately behind the speaker, and the baffle serves to deflect the sound energy eminating from the rear portion of the speaker outwardly through the side openings 16.

It has been found that the best sound performance is achieved if the angle between each side section 18 and 19 and the corresponding side wall 1 is approximately 30°, and the angle between the central sections 20 and 21, as shown in FIG. 3, is approximately 65°.

The space between the baffle 17 and the rear wall 3 can be filled with a sound insulating material 23.

The use of the baffle 17 results in a more complete sound in that substantially all of the sound generated by the speaker 14 is delivered forwardly from the cabinet, which results in greater fidelity.

Various modes of carrying out the invention are contemplated as being within the scope of the following claims particularly pointing out and distinctly claiming the subject matter which is regarded as the invention.

I claim:

1. A speaker enclosure, comprising a cabinet having a pair of side walls, a top wall, a rear wall, and an internal generally horizontal wall, said horizontal wall dividing the cabinet into an upper compartment and a lower compartment; a first sound emitting member mounted in the upper compartment with the outlet of said member facing forwardly, a first baffle disposed horizontally across the outlet of said first member and having a pair of forwardly diverging surfaces to deflect the sound energy emanating from said first member upwardly and downwardly, a second sound emitting member mounted in the lower compartment and spaced from the side walls of the cabinet to provide a pair of side openings on either side of said second member, said openings being unobstructed and extending the full height of the lower compartment, and a second baffle disposed in the lower compartment and located to the rear of said second member and having a W-shaped configuration in horizontal cross section and extending the full height of said lower compartment, said second baffle having a central vertically extending apex disposed in proximate relation to the rear end of said second member, the sound energy emanating from the rear portion of said second member being deflected forwardly by said second baffle and delivered through said side openings.

2. A speaker enclosure, comprising a cabinet having a pair of side walls, a front wall, a rear wall and a generally horizontal upper wall, said walls defining a compartment, the side edges of the front wall being spaced from the respective side walls to define a pair of unobstructed openings that extend the full height of the compartment, a speaker mounted in the front wall with the outlet of said speaker facing forwardly, a baffle disposed within the compartment and located to the rear of said speaker and having a W-shaped configuration in horizontal cross section, said baffle including a pair of side sections and a pair of central sections, the outer vertical edges of said side sections being connected to the forward edge portions of the side walls and the inner vertical edges of said side sections being connected to the outer vertical edges of the central sections, the inner vertical edges of said central sections being joined at a vertically extending apex disposed immediately adjacent the rear of said speaker, sound energy eminating from the rear portion of said speaker being deflected forwardly by the baffle and delivered through said unobstructed side openings.

3. The speaker enclosure of claim 2, and including a layer of sound insulating material disposed between the rear wall and the rear surface of said baffle.

* * * * *

UNITED STATES PATENT AND TRADEMARK OFFICE

CERTIFICATE OF CORRECTION

PATENT NO. : 4,301,889

DATED : November 24, 1981.

INVENTOR(S) : DAVID V. TRALONGA

It is certified that error appears in the above–identified patent and that said Letters Patent are hereby corrected as shown below:

Cover Page at [76] Cancel "Inventor: DAVID V. TRALONGA" and substitute therefor ---Inventor: DAVID V. TRALONGO---

Signed and Sealed this

*Twenty-seventh* Day of *April 1982*

[SEAL]

*Attest:*

GERALD J. MOSSINGHOFF

*Attesting Officer* *Commissioner of Patents and Trademarks*